US012699830B2

(12) United States Patent
Gao et al.

(10) Patent No.: US 12,699,830 B2
(45) Date of Patent: Aug. 4, 2026

(54) FIELD-NET FOR PLACEMENT EVALUATION

(71) Applicant: Synopsys, Inc., Sunnyvale, CA (US)

(72) Inventors: Xiang Gao, San Jose, CA (US);
Yi-Min Jiang, Campbell, CA (US);
Manish Sharma, San Jose, CA (US)

(73) Assignee: Synopsys, Inc., Sunnyvale, CA (US)

( * ) Notice: Subject to any disclaimer, the term of this patent is extended or adjusted under 35 U.S.C. 154(b) by 685 days.

(21) Appl. No.: 18/211,851

(22) Filed: Jun. 20, 2023

(65) Prior Publication Data

US 2023/0409791 A1    Dec. 21, 2023

Related U.S. Application Data

(60) Provisional application No. 63/354,098, filed on Jun. 21, 2022.

(51) Int. Cl.
*G06F 30/30* (2020.01)
*G06F 30/3323* (2020.01)
*G06N 3/092* (2023.01)

(52) U.S. Cl.
CPC ......... *G06F 30/3323* (2020.01); *G06N 3/092* (2023.01)

(58) Field of Classification Search
USPC ......................... 716/100, 104, 106, 110, 111
See application file for complete search history.

(56) References Cited

U.S. PATENT DOCUMENTS

| | | | | |
|---|---|---|---|---|
| 6,212,666 B1 * | 4/2001 | Gohl | ................... | G06F 30/3312 |
| | | | | 716/108 |
| 6,301,686 B1 * | 10/2001 | Kikuchi | ................ | G06F 30/398 |
| | | | | 716/135 |
| 2002/0100007 A1 * | 7/2002 | Teig | ....................... | G06F 30/394 |
| | | | | 716/124 |

* cited by examiner

*Primary Examiner* — Brian Ngo
(74) *Attorney, Agent, or Firm* — Patterson + Sheridan, LLP

(57) ABSTRACT

The present disclosure describes a system and method for determining a function for a quality of results (QoR) for a circuit design. The method includes receiving a circuit design that includes a first node, a second node, and a connection between the first node and the second node in a design space, placing an array of points within the design space, sampling first field values of the circuit design at each point of the array of points, and determining a first sampled function based on the first field values. The method includes moving the array of points within the design space, sampling second field values of the circuit design at each point of the array of points, determining a second sampled function based on the second field values, and determining a function based on the first and second sampled functions. The function produces a QoR for the circuit design.

20 Claims, 8 Drawing Sheets

600

Start

Receive circuit design — 602

Place array of points — 604

Sample function — 606

Move array of points — 608

Sample function — 610

Analyze sampled functions — 612

Determine function — 614

Determine QoR — 616

Adjust circuit design — 618

End

FIELD-NET FOR PLACEMENT EVALUATION

RELATED APPLICATION

This application claims priority to and the benefit of U.S. Provisional Patent Application Ser. No. 63/354,098, entitled "Field-Net for Placement Evaluation" filed Jun. 21, 2022, which is incorporated herein by reference in its entirety.

TECHNICAL FIELD

The present disclosure relates to electronic circuit design.

BACKGROUND

Placement, clock tree synthesis, and routing are closely related in the physical design of an electronic circuit, but they are performed by separate engines as separate steps in model electronic design automation (EDA) design flows. Co-optimization may be used in existing design processes. One example is to optimize placement for best post routing quality of results (QoR). There are several types of approaches to the placement prediction problem used in optimization. For example, certain processes may use machine learning predictions based on placement features and final QoR targets, and leverage training data from different designs. As another example, certain processes may use fast wirelength and congestion proxy functions to train the value network and policy network in a reinforcement learning framework. These processes, however, do not precisely model the geometry of macros and cells within the circuit design.

SUMMARY

The present disclosure describes a system and method for determining a function for a quality of results (QoR) for a circuit design. According to an embodiment, a method includes receiving a first circuit design that includes a first node, a second node, and a connection between the first node and the second node. The first node, the second node, and the connection occupy a portion of a design space. The method also includes placing an array of points within the design space, sampling first field values of the first circuit design at each point of the array of points, and determining, by a processor, a first sampled function based on the first field values. The method further includes moving the array of points within the design space, after moving the array of points, sampling second field values of the first circuit design at each point of the array of points, determining, by the processor, a second sampled function based on the second field values, and determining, by the processor, a function based on the first sampled function and the second sampled function. The function produces a QoR for the first circuit design.

The method may include moving at least one of the first node or the second node within the design space and sampling third field values of the first circuit design at each point of the array of points after moving at least one of the first node or the second node. Determining the function may further based on the third field values.

The method may include determining a function for a scalar target or a 2D map target based on the function.

The method may include receiving a second circuit design and determining, for the second circuit design, a QoR using the function. The method may include moving a node or a connection in the second circuit design based on the determined QoR for the second circuit design.

The function may be based at least in part on a first function describing an effect of the first node on the QoR for the first circuit design, a second function describing an effect of the second node on the QoR for the first circuit design, and a third function describing an effect of the connection on the QoR for the first circuit design. The function may include a sum of the first function, the second function, and the third function. The first function may be based at least in part on a position of the first node in the design space and a dimension of the first node. The third function may be based at least in part on a position of the connection in the design space and a length of the connection.

The function may be determined using a neural network.

According to another embodiment, a system includes a memory and a processor communicatively coupled to the memory. The processor receives a first circuit design comprising a first node, a second node, and a connection between the first node and the second node. The first node, the second node, and the connection occupy a portion of a design space. The processor places an array of points within the design space, samples first field values of the first circuit design at each point of the array of points, and determines a first sampled function based on the first field values. The processor also moves the array of points within the design space, after moving the array of points, samples second field values of the first circuit design at each point of the array of points, determines a second sampled function based on the second field values, and determines a function based on the first sampled function and the second sampled function. The function produces a QoR for the first circuit design.

The processor may move at least one of the first node or the second node within the design space and sample third field values of the first circuit design at each point of the array of points after moving at least one of the first node or the second node to produce a third sampled function. Determining the function may be further based on the third sampled function.

The processor may determine a function for a scalar target or a 2D map target based on the function.

The processor may receive a second circuit design and determine, for the second circuit design, a QoR using the function. The processor may move a node or a connection in the second circuit design based on the determined QoR for the second circuit design.

The function may be based at least in part on a first function describing an effect of the first node on the QoR for the first circuit design, a second function describing an effect of the second node on the QoR for the first circuit design, and a third function describing an effect of the connection on the QoR for the first circuit design. The function may include a sum of the first function, the second function, and the third function. The first function may be based at least in part on a position of the first node in the design space and a dimension of the first node. The third function may be based at least in part on a position of the connection in the design space and a length of the connection.

According to another embodiment, a non-transitory computer readable medium stores instructions for determining a function for a QoR of a circuit design. The instructions, when executed by a processor, cause the processor to sample first field values of the circuit design at each point of an array of points placed in a design space. A portion of the design space is occupied by the circuit design. The processor also determines a first sampled function based on the first field values, after producing the first sampled function, moves the array of points within the design space, and after moving the array of points, samples second field values of the circuit design at each point of the array of points. The processor further determines a second sampled function based on the second field values and determines the function for the QoR based on the first sampled function and the second sampled function.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
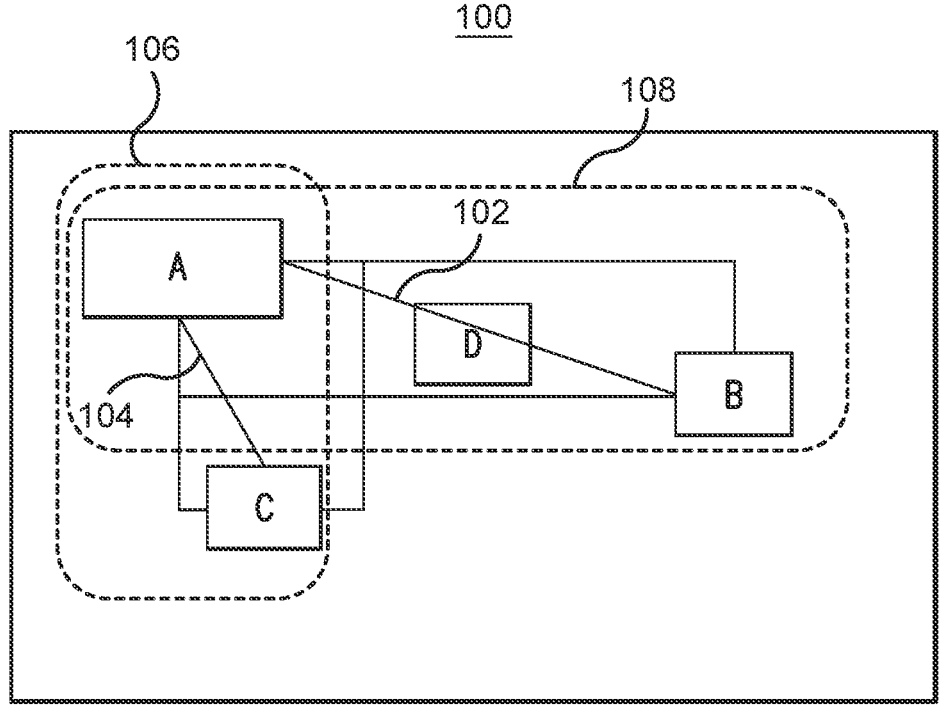
FIG. 1 illustrates example congestion and timing concerns for placements of cells or macros.

Aspects of the present disclosure relate to a field-net for placement evaluation. A technical challenge with existing design processes is that there are no suitable machine learning methods that can learn analytical or continuous functions or no suitable kernels for complex spatial and geometry related problems, such as placement, for supervised or partially supervised problems. The present disclosure describes a system and process that use principles of field theory and machine learning to determine an analytical function that may be used to predict quality of results (QoR) for circuit designs at the placement stage. A design tool may use the analytical function to predict the QoR for a circuit design during placement and to update the QoR as the placement changes. In this manner, the circuit designer may be provided with insight as to how to improve the circuit design during placement.

Generally, the system analyzes the cells and connections in various circuit design placements to determine the analytical function that describes the QoR. Each circuit design may have cells, macros, and connections placed into a design space. There may be many different factors to consider when determining the placement of the cells, macros, and connections. Some of these factors may even impact each other. For example, it may reduce routing demand to place cells further apart from each other, but doing so may increase wirelength, which may be undesirable. As a result, these factors push and pull the cells, macros, and connections towards or away from different locations in the design space, like a field. This field, however, changes based on the different types of cells, macros, and connections in the circuit design, as well as the geometry and positioning of the cells, macros, and connections in the design space. Understanding this field and how the field behaves would yield a prediction of the QoR for the circuit design. The system uses machine learning (e.g., a neural network) to determine a function that expresses or describes the field and the field's behavior. The system may then apply this function to different circuit designs to predict or determine the QoR for those circuit designs at the placement stage.

To learn the function, the system may place an array of points within a design space with a circuit design and then sample the values of the field at the points in the array. To sample the values of the fields at the points in the array, the system may determine the contribution of the various factors that impact the field at the points, such as routing demand and wirelength. After sampling the value of the field at the points in the array, the system may determine a sampled function that describes or expresses the sampled field values. The system may then move the array of points in the design space and re-sample the field values at the points in the moved array. The system may determine another sampled function that describes or expresses the re-sampled field values. In some iterations, instead of moving the array of points, the system may move cells, macros, or connections in the design space, or the system may increase or decrease the density of the array of points (e.g., increase or decrease the number of points in the array). This process may be repeated any number of times to produce any number of sampled functions. The system may analyze the sampled functions (e.g., using a neural network) to determine an analytical function that describes or expresses the field, which would also yield a prediction of the QoR. The system may then use the function to predict the QoR for subsequent circuit designs during placement.

At a theoretical level, the system is based on learnable field functions that capture the dynamics among cells, macros, pins, and wires, etc. of a circuit design. The field functions are learnable continuous or analytical functions. To improve its precision in geometry, controlled collocation points are used during the training phase. The collocation, which can be randomly shifted in the minibatch for better precision and coverage, is also used in the pooling operations, such as max or average pooling for scalar targets, or resampling for 2D/3D spatial map targets. The field functions learned from this training step would then be applicable for unseen objects and unseen collocation in testing. The system may be applied to other problems as well, such as, protein folding, city planning, etc.

A chip typically has many routing tracks in the horizontal and vertical directions. That means macro placement should have high precision in location, and placement quality might be susceptible to small changes in a macro's location. This situation alone poses a significant challenge to existing machine learning techniques. For imaging problems that detect objects' shapes, relative locations, structures, etc., convolutional neural networks (CNNs) use small neighborhood kernels to extract spatial features, and then local and global spatial information can be learned via many layers of such convolution kernels. However, applying CNN with full resolution for placement would be extremely inefficient and impractical. On the other hand, graph neural networks (GNNs) can utilize the connectivity information from the connection graph and take geometry inputs directly as continuous variables, but critical local physical neighborhood or structural information is completely absent from the connectivity graph. The placement problem, however, is strongly influenced by the dynamics within the local neighborhood, where nodes (e.g., cells, macros, pins, etc.) and edges (e.g., wires, interconnections, etc.) all compete for routing resources and at the same time attract each other for better timing and utilization. This would pose a significant challenge for adopting GNN to placement predictions. Lastly, existing EDA design tools support various chip designs that would require the adopted machine learning solutions to support cross-design predictions for many kinds of netlists, macro to standard cell ratios, technology nodes, etc.

In certain embodiments, the system provides several technical advantages. For example, the system determines a function that can be used to determine and update the QoR for a circuit design at the placement stage. As a result, the system conserves computing resources (e.g., processor and memory resources) by not having to use a CNN or GNN to evaluate the circuit design to determine the QoR, especially as changes and updates are made to the circuit design. Additionally, by determining and updating the QoR during placement, the system further conserves computing resources by providing insight as to how to improve the circuit design during placement, rather than providing such insight in later stages. Specifically, the system conserves computing resources by not performing subsequent design stages before determining the QoR.

Macros and cells interact with each other for concerns over wirelength and congestion. FIG. 1 illustrates an example design space 100 that includes nodes labeled A, B, C, and D. These nodes may represent cells or macros in a circuit design. There is an interconnect 102 between the nodes A and B and another interconnect 104 between the nodes A and C. As seen in FIG. 1, the interconnect 102 between nodes A and B and the interconnect 104 between nodes A and C would require routing resources within the dotted boxes 106 and 108 (which may be referred to as utilization boxes 106 and 108). The demand for routing would be easier to meet if the dotted boxes 106 and 108 are large in both the vertical and horizontal directions. Also, additional nodes placed within the utilization boxes 106 and 108 would increase the demand within the boxes 106 and 108 and possibly decrease the supply within the utilization boxes 106 and 108 as well, because the area occupied by the nodes cannot be used for wiring. The overlapped region between the boxes 106 and 108 would have higher demand for routing resources than non-overlapped regions, thus congestion is more likely to occur. The remedy for congestion is to enlarge the utilization boxes 106 and 108, hence separating the connected nodes A, B, and C further apart. However, timing and utilization considerations would prefer smaller half-perimeter wirelength (HPWL), or connected nodes being closely packed. This dynamic behavior can be approximated by string-connected charged objects. But this approximation is not accurate, because its dynamic is not the same as the congestion and timing dynamics as described. The situation for macros is even more complicated, because the interconnections between macros are a network of wires and cells, with many different options for paths that connect the macros together.

Under the imperative for best physical synthesis, the best location adjustment of nodes (e.g., cells and macros) and edges (e.g., interconnects) during placement and routing, especially during local optimization, may move nodes and edges around as if there is an invisible force to push (or attract) nodes and edges to the local optimal solution. To account for the invisible force, the concept of "field" that Faraday used for explaining the action-at-a-distance phenomenon in electromagnetics may be used. Conceptually, there is an invisible field from the node and edge element, and this invisible field would push the nodes and edges to a locally optimal placement solution. When the nodes and edges are frozen (e.g., after the placement step), the field would yield something like the energy state. Evaluating the energy state would yield the quality of the placement solution. The system's goal is to learn such field functions via machine learning. Because of the complex behavior of macros, cells, and their interconnects, the field function may be more complicated than the static charge field used by traditional placement engines, and could even be directional, because the geometry is either vertical or horizontal. The interaction among those fields, or the superposition of them, may give the overall placement quality, which can be directly obtained from real EDA tool runs.

Figure 2:
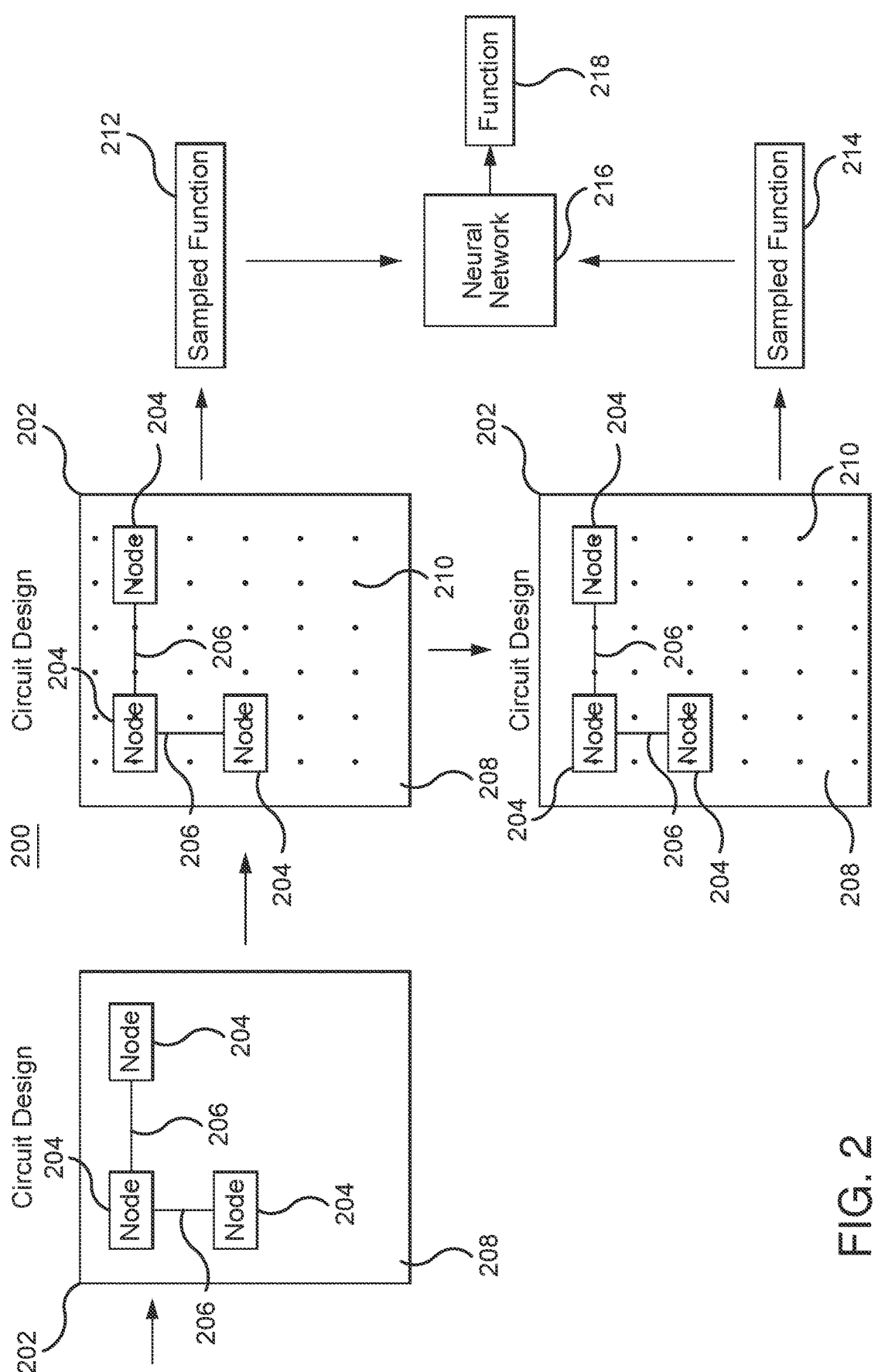
FIG. 2 illustrates an example system for determining a function for a metric of a circuit design.

The present disclosure describes a system and method for using machine learning to determine the field. FIG. 2 illustrates an example system 200 for determining a function for a metric of a circuit design. The system 200 may be a computer system (e.g., the computer system 800 shown in FIG. 8). Generally, the system 200 places an array of points into a design space occupied by the circuit design. The system then samples values of a field at each point of the array of points. The value of the field at a point may be affected by several factors including routing demand and (wirelength) supply. The system may then determine a sampled function that describes or expresses the sampled field values. The system may then move the array of points in the design space and re-sample the values of the field at each point of the moved array. The system may then determine another sampled function that describes or expresses the re-sampled field values. The system 200 may use machine learning to analyze the sampled functions to determine a function that describes or expresses the field or the behavior of the field, which would also produce the QoR for the circuit design placement. The system 200 may apply this function to subsequent circuit designs to determine the QoRs for those circuit designs at the placement stage.

The system 200 begins by receiving a circuit design 202. The system 200 may receive the circuit design 202 from a circuit designer. As seen in FIG. 2, the circuit design 202 includes one or more nodes 204 and one or more interconnections 206. The nodes 204 may represent cells or macros in the circuit design 202, which may include one or more circuit components (e.g., analog circuit components or digital circuit components). The interconnections 206 may represent electrical connections between the nodes 204. For example, the interconnections 206 may represent wires that connect the nodes 204 or that connect the circuit components represented by the nodes 204.

The circuit design 202 may occupy a portion of a design space 208. For example, the nodes 204 and the interconnections 206 may occupy a portion of the design space 208. As seen in FIG. 2, the positioning of the nodes 204 and the interconnections 206 may form a particular geometry in the design space 208. Different factors or metrics (e.g., congestion, timing, power, and wirelength) may be affected by the positioning and size of the nodes 204 and interconnections 206 in the design space 208. Moving the nodes 204 in the design space 208 may cause the interconnections 206 to also move, extend, or shrink in the design space 208. As a result, changes to the circuit design 202 may change the values of the factors or metrics. These factors or metrics may tend to push or pull the nodes 204 and interconnections 206 towards or away from different areas of the design space. As a result, these factors or metrics may resemble a field.

The system 200 may arrange an array 210 of points into the design space 208. As seen in FIG. 2, the array 210 may be positioned in the design space 208. Some of the points in the array 210 may overlap empty space in the design space 208. Other points in the array 210 may overlap components of the circuit design 202 (e.g., nodes 204 or interconnections 206) in the design space 208. The system 200 may sample the values of the field at each point in the array 210. A value of the field at a point may be a combination of the contributions, at that point, of the nodes 204 and interconnections 206 to the various factors or metrics that contribute to the field. For example, for each node 204 or interconnection 206, the system 200 may be provided with a function that expresses or describes how that node 204 or interconnection 206 affects the factors or metrics (and by extension the field) at a point in the design space. The system 200 may sample or consider the contribution, at a point in the array 210, to the field from each node 204 and interconnection 206 when determining the value of the field at that point.

After sampling the values of the field at the points in the array 210, the system 200 determines a sampled function 212 that expresses or describes the sampled values of the field. The sampled function 212 may not express the field or the behavior of the field exactly, because the sampled values used to determine the sampled function 212 are only for specific points in the field.

After producing the sampled function 212, the system 200 may move, shift, rotate, or increase/decrease the density of the array 210 of points in the design space 208. For example, the system 200 may move the array 210 of points in any direction in the design space 208. As a result, some of the points in the array 210 may be moved to overlap with components of the circuit design 202, while other points in the array 210 may be moved to overlap empty space in the design space 208. After moving the array 210, the system 200 may re-sample the values of the field at each point in the moved array 210 and determined another sampled function 214 that expresses or describes the re-sampled values of the field. The sampled function 214 may be different from the sampled function 212, because the points in the array 210 have been moved. The system 200 may repeat the process of moving, rotating, or increasing/decreasing the density of the array 210 and re-sampling the values of the field any number of times to produce any number of sampled functions.

After the system 200 has completed moving the array 210 and sampling the functions, the system 200 may analyze the sampled functions using machine learning. In the example of FIG. 2, the system 200 uses a neural network 216 to analyze the sampled functions 212 and 214. The neural network 216 may analyze the sampled functions 212 and 214 to determine or learn a mathematical function 218 that captures or describes the field or the behavior of the field as a function of the placement of the nodes 204 and interconnections 206. For example, the neural network 216 may analyze the sampled functions 212 and 214 to determine patterns or trends in the sampled functions 212 and 214 in relation to the positioning of the points in the array 210 and the positioning of the nodes 204 and the interconnections 206. The neural network 216 may determine a mathematical function 218 that describes or captures these trends or patterns in the sampled functions 212 and 214. The function 218 may express or describe the field or the behavior of the field as a function of the sizes, dimensions, or positioning of nodes 204 and/or interconnections 206 in the design space 208. Thus, this function 218 also expresses the behavior of the QoR for the placement of circuit designs as the function describes how close the placement of the nodes 204 and interconnections 206 is to an optimal placement that balances the competing factors or metrics that affect QoR (e.g., routing demand, congestion, wirelength, etc.).

Figure 3:
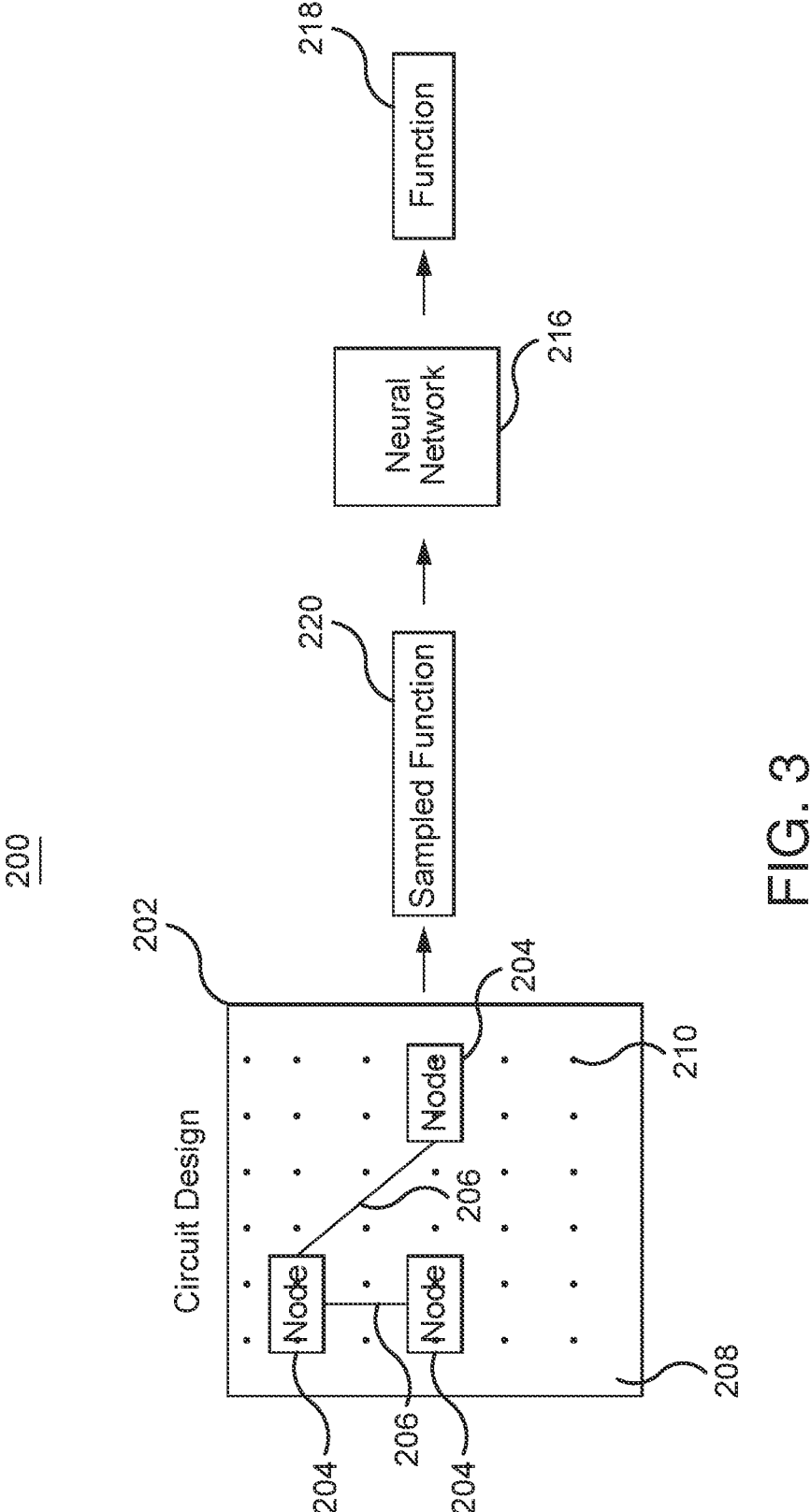
FIG. 3 illustrates an example step in determining the function using the system of FIG. 2.

The system 200 may make other types of adjustments while sampling values for the field. FIG. 3 illustrates an example step in determining the function 218 using the system 200 of FIG. 2. In the example of FIG. 3, the system 200 does not move or shift the array 210 of points in the design space 208. Rather, the system 200 moves the components of the circuit design 202 in the design space 208 while maintaining the array 210 of points. As seen in FIG. 3, the system 200 moves one of the nodes 204 in the circuit design 202 to another position in the design space 208. As a result, the interconnection 206 connected to that node 204 also shifts and elongates. Due to the movement of the node 204 and the changes to the interconnection 206, the values of the field for the circuit design 202 may also change.

The system 200 re-samples the values of the field at each point in the array 210. The system 200 then determines the sampled function 220 that expresses or describes the re-sampled values of the field. The sampled function 218 may differ from the sampled functions 212 and 214, because the sampled function 218 is determined using the values of the field with the change to the circuit design 202. The system 200 may analyze the sampled function 218 using the neural network 216, along with the sampled functions 212 and 214, when determining the function 218. Thus, the example of FIG. 3 shows that the system 200 may not only move the array 210 of points in the design space 208 when sampling the values of the field, but the system 200 may also move components of the circuit design 202 in the design space 208. As a result, the function 218 may better capture or express the behavior of the field and how QoR is impacted by the components of the circuit design 202 and their positioning within the design space 208.

In some embodiments, the system 200 changes the number of points in the array 210 of points or the density of the array 210 and re-samples the values of the field. For example, the system 200 may reduce the pitch of the array 210, which may increase the number of points in the array 210. The system 200 may then re-sample the values of the field at each of the points in the array 210 with the reduced pitch, which may produce more sampled values due to the increased number of points. The system 200 may then determine a sampled function that expresses or describes the sampled values and use the neural network 216 to consider the sampled function when determining or learning the function 218.

Figure 4:
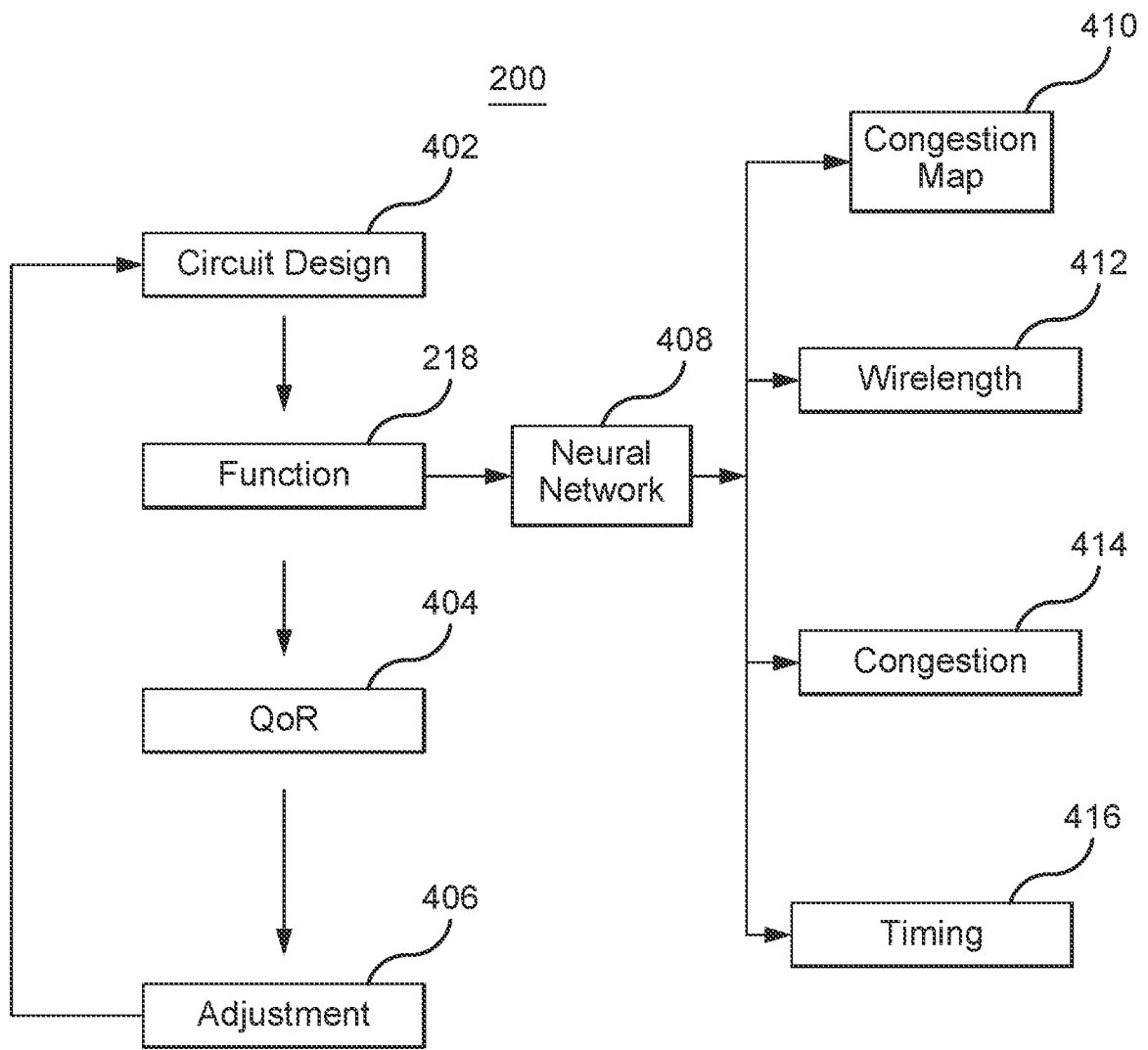
FIG. 4 illustrates an example use of a determined function using the system of FIG. 2.

The system 200 may use the determined function 218 to analyze and adjust subsequent circuit designs. FIG. 4 illustrates an example use of a determined function 218 using the system 200 of FIG. 2. As seen in FIG. 4, the system 200 may receive another circuit design 402. The system 200 may receive the circuit design 402 from a circuit designer. The circuit design 402 may be different from the circuit design 202 that was used to determine the function 218. For example, the circuit design 402 may include different nodes and interconnections with different positions in the design space.

The system 200 applies the function 218 to the circuit design 402 to determine a QoR 404 for the circuit design 402. For example, the function 218 may receive as inputs the positioning of nodes and interconnections in the circuit design 402, and the function 218 may output the QoR 404 for the circuit design.

The system 200 may then determine or make an adjustment 406 to the circuit design 402 based on the QoR 404. For example, if the QoR 404 is too low, the circuit designer may use the system 200 to make the adjustment 406 to the circuit design 402 to increase the QoR 404. The adjustment 406 may include changes to the sizes or positioning of the nodes and interconnections in the circuit design 402. As another example, the adjustment 406 may include changing the circuit components in the circuit design or re-routing some of the connections. When the adjustment 406 is made to the circuit design 402, the system 200 may re-apply the function 218 to the adjusted circuit design 402 to update the QoR 404. In this manner, the system 200 may use the function 218 to update the QoR 404 on the fly as adjustments 406 are made to the circuit design 402. As a result, the system 200 may notify a circuit designer of how the QoR 404 changes as the circuit designer makes adjustments 406 to the circuit design 402 (e.g., during the placement stage).

The adjustment 406 may include any suitable change to the circuit design 402. For example, the adjustment may include moving one or more of a node or interconnection in the circuit design 402. As another example, the adjustment 406 may include resizing one or more of a node or interconnection in the circuit design 402. As another example, the adjustment 406 may include adding a node or interconnection to the circuit design 402 or removing a node or interconnection from the circuit design 402.

In some embodiments, the computer system 200 may use a neural network 408 to analyze the function 218 to predict scalar targets or 2D map targets. For example, the neural network 408 may use pooling (e.g., average pooling, max pooling, etc.) to predict or learn functions that express or describe scalar targets (e.g., wirelength 412, congestion 414, and timing 416). As another example, the neural network 408 may use resampling to predict or learn functions that express or describe 2D map targets (e.g., congestion map). The computer system 200 may apply these functions to subsequent circuit designs to determine the values of the scalar targets and 2D map targets for those circuit designs. The computer system 200 may also use these functions to update the scalar targets and 2D map targets as adjustments are made to the circuit designs.

Figure 5:
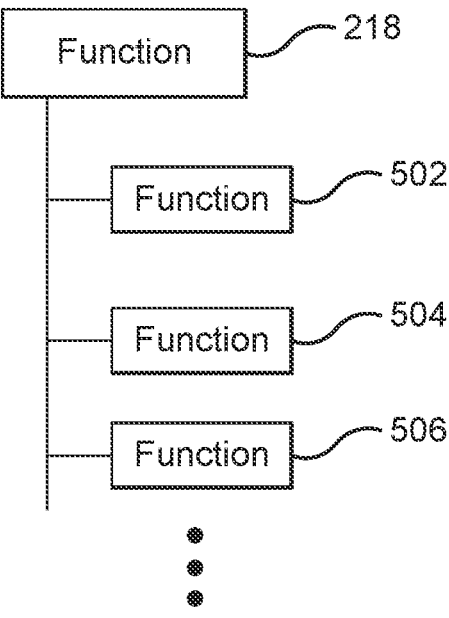
FIG. 5 illustrates an example function in the system of FIG. 2.

The function 218 may be a combination of multiple functions that express the effect of various components of a circuit design on the QoR. FIG. 5 illustrates an example function 218 in the system 200 of FIG. 2. As seen in FIG. 5, the function 218 includes one or more sub-functions. For example, the function 218 may include the sub-functions 502, 504, and 506. Each of the sub-functions may express or describe how a component of a circuit design affects the QoR. For example, the sub-function 502 may express or describe how a node (e.g., the size or dimensions of the node or the positioning of the node) affects the QoR. The sub-function 504 may express or describe how another node (e.g., the size or dimensions of the node or the positioning of the node) affects the QoR. The sub-function 506 may express or describe how an interconnection (e.g., the positioning of the interconnection or a length of the interconnection) affects the QoR. The function 218 may include any number of sub-functions that express or describe how nodes and interconnections in the circuit design affect the QoR.

The sub-functions 502, 504 and 506 may be mathematically combined to form the function 218. For example, the function 218 may include a sum of the sub-functions 502, 504, and 506. As another example, the function 218 may include a product of one or more of the sub-functions 502, 504, and 506. As a result, the function 218 expresses or describes the effect of the components of the circuit design on the QoR for the circuit design.

Figure 6:
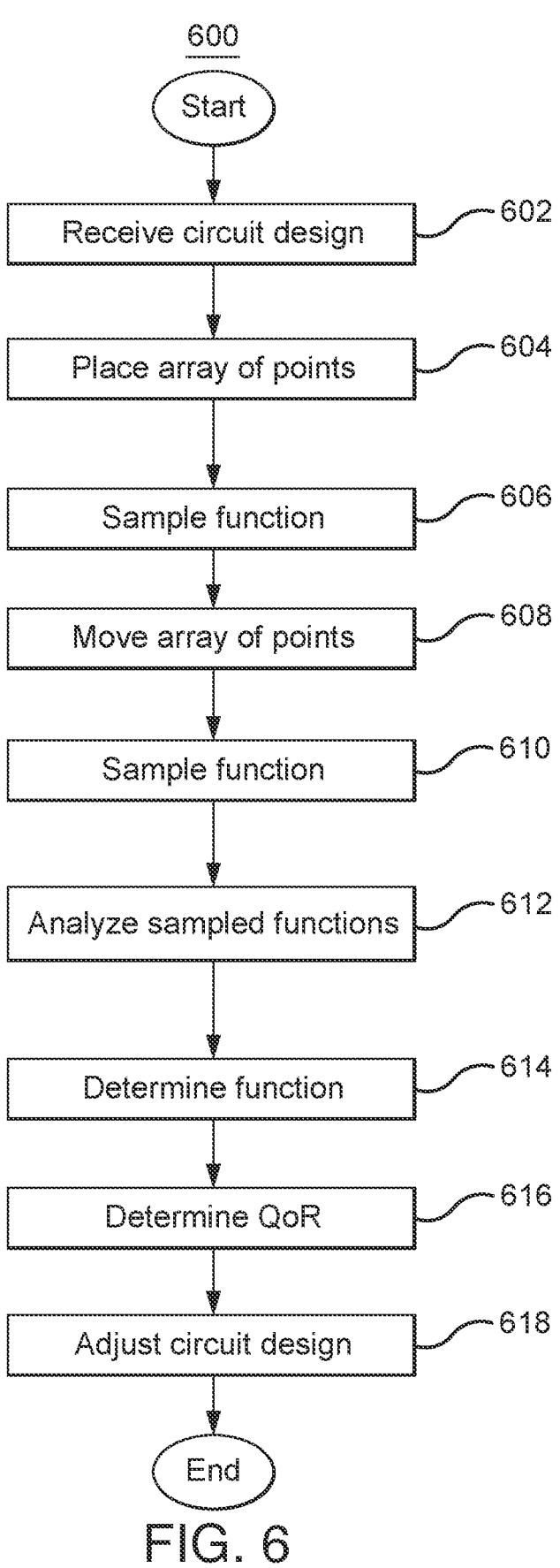
FIG. 6 is a flowchart of an example method for determining and using a function for a metric of a circuit design.

FIG. 6 is a flowchart of an example method 600 for learning and using the function 218. In certain embodiments, a computer system (e.g., the computer system 800 shown in FIG. 8) performs the method 600. By performing the method 600, the computer system uses machine learning to determine the function 218. The computer system may use the function 218 to determine and update the QoR for other circuit designs.

At 602, the computer system receives a circuit design 202. The circuit design 202 may include one or more nodes 204 and one or more interconnections 206 that connect the nodes 204. The nodes 204 and interconnections 206 may occupy a portion of a design space 208. The nodes 204 and interconnections 206 may be resized and moved within the design space 208.

At 604, the computer system places an array 210 of points within the design space 208. The array 210 of points may overlap different parts of the design space 208. For example, some of the points in the array 210 may overlap a component of the circuit design 202 in the design space 208. Other points in the array 210 may overlap empty space in the design space 208.

At 606, the computer system determines a sampled function 212. The computer system may sample values of a field of the circuit design 202 at each point of the array 210. A value of the field at a point may be a combination of the contributions, at that point, of the nodes 204 and interconnections 206 to the various factors or metrics that contribute to the field. For example, for each node 204 or interconnection 206, the system 200 may be provided with a function that expresses or describes how that node 204 or interconnection 206 affects the factors or metrics (and by extension the field) at a point in the design space. These factors or metrics may include routing demand and wirelength. Thus, the field may represent the tendency of these factors or metrics (in combination), at these points, to push or pull the nodes 204 and interconnections 206 towards or away from the point. The system 200 may sample or consider the contribution, at a point in the array 210, to the field from each node 204 and interconnection 206 when determining the value of the field at that point. After determining the values of the field at the points in the array 210, the computer system may determine the sampled function 212 that expresses or describes the sampled values of the field.

At 608, the computer system moves the array 210 of points in the design space 208. For example, the computer system may shift or rotate the array 210 of points in the design space 208. As a result, the points in the array 210 may be moved to overlap different parts of the design space 208. For example, some points that overlapped a component of the circuit design 202 may be moved to overlap empty space in the design space 208, and vice versa.

At 610, the computer system samples the values of the field of the circuit design 202 at the points of the moved array 210. Due to the movement of the array 210, the values of the field at the points may change. The computer system may then determine the sampled function 214 that expresses or describes the sampled values of the field at the points in the moved array 210. The computer system may repeat 608 and 610 any number of times to produce any number of sampled functions.

At 612, the computer system analyzes the sampled functions 212 and 214 using machine learning. For example, the computer system may use the neural network 216 to analyze the sampled functions 212 and 214. The neural network 216 may learn patterns or trends in the sampled functions 212 and 214.

At 614, the computer system determines the function 218. The neural network 216 may output the function 218 based on its analysis of the sampled functions 212 and 214. The function 218 may be a mathematical function that expresses the behavior of the field in the design space 208. For example, the function 218 may express the behavior of the field as a function of the size, dimensions, or positioning of nodes and interconnections in the design space. Consequently, the function 218 also may be applied to determine the QoR for a circuit design, because the function 218 may express how close the circuit design is to an optimal or better placement or solution. This function 218 may then be applied to subsequent circuit designs.

At 616, the computer system determines the QoR for another circuit design 402 using the function 218. For example, the computer system may input into the function 218 the positioning and dimensions or sizes of the components of the subsequent circuit design 402. The function 218 may then output the QoR 404 for the subsequent circuit design 402.

At 618, the computer system may adjust the subsequent circuit design 402 to adjust the QoR 404. For example, the computer system may resize or move one or more of the components of the subsequent circuit design 402. After adjusting the subsequent circuit design 402, the computer system may apply the function 218 to the adjusted circuit design to update the QoR 404. In this manner, the computer system may use the function 218 to determine and update the QoR 404 as adjustments are made to the subsequent circuit design 402.

Figure 7:
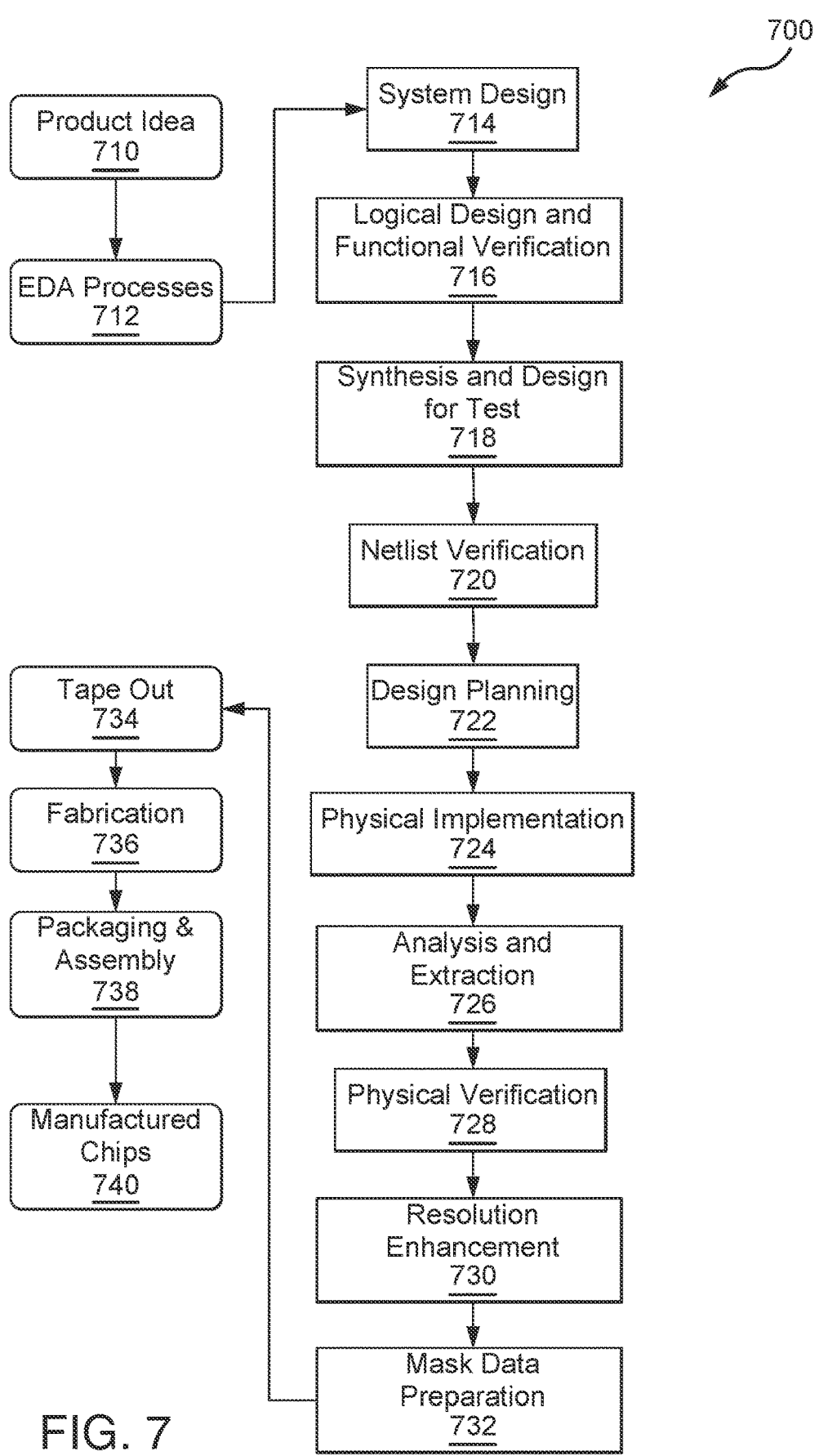
FIG. 7 depicts a flowchart of various processes used during the design and manufacture of an integrated circuit in accordance with some embodiments of the present disclosure.

FIG. 7 illustrates an example set of processes 700 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 710 with information supplied by a designer, information which is transformed to create an article of manufacture that uses a set of EDA processes 712. When the design is finalized, the design is taped-out 734, which is when artwork (e.g., geometric patterns) for the integrated circuit is sent to a fabrication facility to manufacture the mask set, which is then used to manufacture the integrated circuit. After tape-out, a semiconductor die is fabricated 736 and packaging and assembly processes 738 are performed to produce the finished integrated circuit 740.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding systems of that layer (e.g., a formal verification system). A design process may use a sequence depicted in FIG. 7. The processes described by be enabled by EDA products (or EDA systems).

During system design 714, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 716, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 718, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 720, the netlist is checked for compliance with timing constraints and for correspondence with the HDL code. During design planning 722, an overall floor plan for the integrated circuit is constructed and analyzed for timing and top-level routing.

During layout or physical implementation 724, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 726, the circuit function is verified at the layout level, which permits refinement of the layout design. During physical verification 728, the layout design is checked to ensure that manufacturing constraints are correct, such as DRC constraints, electrical constraints, lithographic constraints, and that circuitry function matches the HDL design specification. During resolution enhancement 730, the geometry of the layout is transformed to improve how the circuit design is manufactured.

During tape-out, data is created to be used (after lithographic enhancements are applied if appropriate) for production of lithography masks. During mask data preparation 732, the 'tape-out' data is used to produce lithography masks that are used to produce finished integrated circuits.

A storage subsystem of a computer system (such as computer system 800 of FIG. 8) may be used to store the programs and data structures that are used by some or all of the EDA products described herein, and products used for development of cells for the library and for physical and logical design that use the library.

Figure 8:
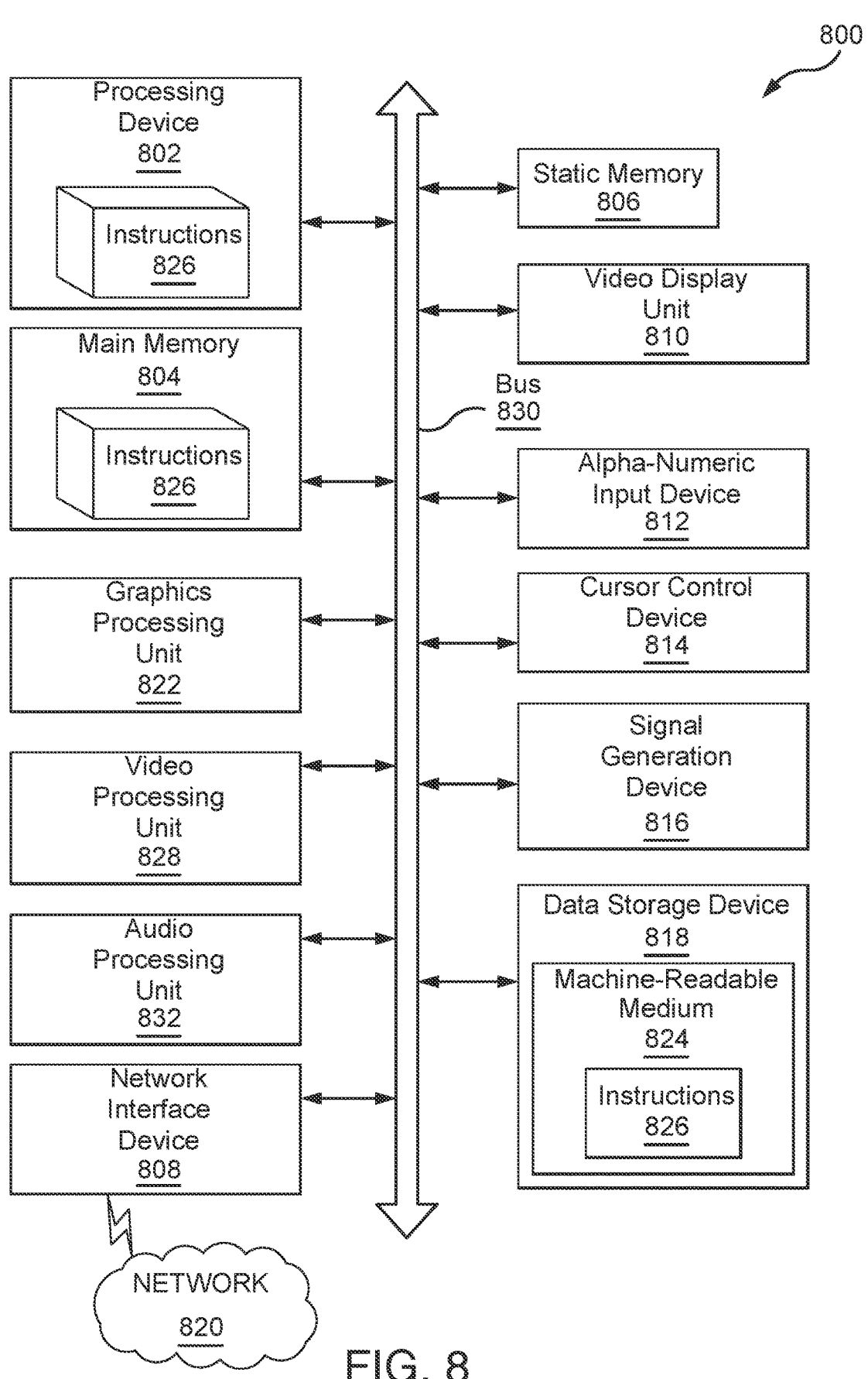
FIG. 8 depicts a diagram of an example computer system in which embodiments of the present disclosure may operate.

FIG. 8 illustrates an example machine of a computer system 800 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM), a static memory 806 (e.g., flash memory, static random access memory (SRAM), etc.), and a data storage device 818, which communicate with each other via a bus 830.

Processing device 802 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 may also be one or more special-purpose processing devices such as an application specific integrated circuit (ASIC), a field programmable gate array (FPGA), a digital signal processor (DSP), network processor, or the like. The processing device 802 may be configured to execute instructions 826 for performing the operations and steps described herein.

The computer system 800 may further include a network interface device 808 to communicate over the network 820. The computer system 800 also may include a video display unit 810 (e.g., a liquid crystal display (LCD) or a cathode ray tube (CRT)), an alphanumeric input device 812 (e.g., a keyboard), a cursor control device 814 (e.g., a mouse), a graphics processing unit 822, a signal generation device 816 (e.g., a speaker), graphics processing unit 822, video processing unit 828, and audio processing unit 832.

The data storage device 818 may include a machine-readable storage medium 824 (also known as a non-transitory computer-readable medium) on which is stored one or more sets of instructions 826 or software embodying any one or more of the methodologies or functions described herein. The instructions 826 may also reside, completely or at least partially, within the main memory 804 and/or within the processing device 802 during execution thereof by the computer system 800, the main memory 804 and the processing device 802 also constituting machine-readable storage media.

In some implementations, the instructions 826 include instructions to implement functionality corresponding to the present disclosure. While the machine-readable storage medium 824 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 802 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method for determining a function for a quality of results (QoR) for a circuit design, the method comprising:
   receiving a first circuit design comprising a first node, a second node, and a connection between the first node and the second node, wherein the first node, the second node, and the connection occupy a portion of a design space;
   placing an array of points within the design space;
   sampling first field values of the first circuit design at each point of the array of points;
   determining, by a processor, a first sampled function based on the first field values;
   moving the array of points within the design space;
   after moving the array of points, sampling second field values of the first circuit design at each point of the array of points;
   determining, by the processor, a second sampled function based on the second field values; and
   determining, by the processor, a function based on the first sampled function and the second sampled function, wherein the function produces a QoR for the first circuit design.

2. The method of claim 1, further comprising:
   moving at least one of the first node or the second node within the design space; and
   sampling third field values of the first circuit design at each point of the array of points after moving at least one of the first node or the second node, wherein determining the function is further based on the third field values.

3. The method of claim 1, further comprising determining a function for a scalar target or a 2D map target based on the function.

4. The method of claim 1, further comprising:
   receiving a second circuit design; and
   determining, for the second circuit design, a QoR using the function.

5. The method of claim 4, further comprising moving a node or a connection in the second circuit design based on the determined QoR for the second circuit design.

6. The method of claim 1, wherein the function is based at least in part on a first function describing an effect of the first node on the QoR for the first circuit design, a second function describing an effect of the second node on the QoR for the first circuit design, and a third function describing an effect of the connection on the QoR for the first circuit design.

7. The method of claim 6, wherein the function comprises a sum of the first function, the second function, and the third function.

8. The method of claim 6, wherein the first function is based at least in part on a position of the first node in the design space and a dimension of the first node.

9. The method of claim 6, wherein the third function is based at least in part on a position of the connection in the design space and a length of the connection.

10. The method of claim 1, wherein the function is determined using a neural network.

11. A system for determining a function for a QoR for a circuit design, the system comprising:
   a memory; and
   a processor communicatively coupled to the memory, the processor configured to:
      receive a first circuit design comprising a first node, a second node, and a connection between the first node and the second node, wherein the first node, the second node, and the connection occupy a portion of a design space;
      place an array of points within the design space;
      sample first field values of the first circuit design at each point of the array of points;
      determine a first sampled function based on the first field values;
      move the array of points within the design space;
      after moving the array of points, sample second field values of the first circuit design at each point of the array of points;
      determine a second sampled function based on the second field values; and
      determine a function based on the first sampled function and the second sampled function, wherein the function produces a QoR for the first circuit design.

12. The system of claim 11, wherein the processor is further configured to:
   move at least one of the first node or the second node within the design space; and
   sample third field values of the first circuit design at each point of the array of points after moving at least one of the first node or the second node to produce a third sampled function, wherein determining the function is further based on the third sampled function.

13. The system of claim 11, wherein the processor is further configured to determine a function for a scalar target or a 2D map target based on the function.

14. The system of claim 11, wherein the processor is further configured to:

receive a second circuit design; and determine, for the second circuit design, a QoR using the function.

15. The system of claim 14, wherein the processor is further configured to move a node or a connection in the second circuit design based on the determined QoR for the second circuit design.

16. The system of claim 11, wherein the function is based at least in part on a first function describing an effect of the first node on the QoR for the first circuit design, a second function describing an effect of the second node on the QoR for the first circuit design, and a third function describing an effect of the connection on the QoR for the first circuit design.

17. The system of claim 16, wherein the function comprises a sum of the first function, the second function, and the third function.

18. The system of claim 16, wherein the first function is based at least in part on a position of the first node in the design space and a dimension of the first node.

19. The system of claim 16, wherein the third function is based at least in part on a position of the connection in the design space and a length of the connection.

20. A non-transitory computer readable medium storing instructions for determining a function for a QoR of a circuit design, wherein the instructions, when executed by a processor, cause the processor to:

sample first field values of the circuit design at each point of an array of points placed in a design space, wherein a portion of the design space is occupied by the circuit design;

determine a first sampled function based on the first field values;

after producing the first sampled function, move the array of points within the design space;

after moving the array of points, sample second field values of the circuit design at each point of the array of points;

determine a second sampled function based on the second field values; and determine the function for the QoR based on the first sampled function and the second sampled function.

* * * * *